(12) United States Patent
Takahashi et al.

(10) Patent No.: US 6,233,821 B1
(45) Date of Patent: May 22, 2001

(54) PROCESSES FOR MANUFACTURING FLEXIBLE PRINTED WIRING BOARDS

(75) Inventors: Satoshi Takahashi; Akira Tsutsumi; Noriaki Kudo; Akihiro Arai; Koji Arai; Koichi Uno; Satoshi Oaku; Osamu Ichihara; Hiromasa Ota, all of Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/267,659

(22) Filed: Mar. 15, 1999

(30) Foreign Application Priority Data

Mar. 20, 1998 (JP) .................................................. 10-090707

(51) Int. Cl.⁷ ..................................................... H05K 3/02
(52) U.S. Cl. .............................. 29/847; 29/825; 174/254; 361/748; 361/749; 428/209; 428/607
(58) Field of Search ............................... 29/825, 830, 846, 29/847, 848; 174/254; 361/748, 749–751; 428/607, 209

(56) References Cited

U.S. PATENT DOCUMENTS

| | | | |
|---|---|---|---|
| 4,293,377 | * 10/1981 | Miyajima | 156/656 |
| 4,353,954 | * 10/1982 | Yamaoka et al. | 428/216 |
| 4,780,957 | * 11/1988 | Shiga et al. | 29/830 |
| 5,089,355 | * 2/1992 | Morita et al. | . |
| 5,789,100 | * 8/1998 | Burroughs et al. | 429/90 |
| 5,986,217 | * 11/1999 | Strum | . |

* cited by examiner

Primary Examiner—Carl J. Arbes
(74) Attorney, Agent, or Firm—Oliff & Berridge, PLC

(57) ABSTRACT

The present invention aims to obtain a flexible printed wiring board with good flatness.

According to the present invention, a copper-clad film 3 is formed by applying a polyamic acid solution on one surface of a copper foil 2 and thermally contracting the polyamic acid layer la so that the other surface of the copper foil 2 may form a convex surface of a curling surface to form a polyimide film 1. A polyamic acid solution is applied on the other surface of the copper foil 2 of the copper-clad film 3, and then the polyamic acid layer 5a is thermally contracted to form a protective film 5, whereby a flexible printed wiring board 10 is obtained.

21 Claims, 1 Drawing Sheet

PROCESSES FOR MANUFACTURING FLEXIBLE PRINTED WIRING BOARDS

FIELD OF THE INVENTION

The present invention relates to a process for manufacturing a metal clad film consisting of a metal foil laminated by an insulating resin layer without using an adhesive layer for a flexible printed wiring board.

Also, the present invention relates to a process for manufacturing a flexible printed wiring board using the metal clad film consisting of a designated printed circuit pattern formed by the metal foil and a cover film protecting the printed circuit.

PRIOR ART

Generally, single-side flexible printed wiring boards consist of a copper-clad film with a designated printed circuit pattern and a cover film for protecting the circuit pattern.

Previously known copper-clad films include a polyimide film adhered to a metal conductor such as a copper foil via an adhesive and a polyimide resin directly applied on or laminated to a metal foil such as a copper foil.

It is known that the circuit region formed of the metal foil is protected by:

(1) printing a solder resist ink or a polyimide varnish on the surface of the copper-clad film;

(2) laminating a polyimide film carrying an adhesive to the copper-clad film; or (3) laminating a film-like polyamic acid which is a precursor of a polyimide resin to the copper-clad film by solvent activity or other means, then forming a polyimide film by imidating the polyamic acid.

However, these conventional techniques had the following problems.

(1) Technique of printing a solder resist ink or a polyimide varnish on the surface of the copper-clad film.

This is a technique in which a resist ink is printed using a silk screen in the same manner as for hard printed wiring boards. It has the disadvantage that the resist ink is less flexible because it is based on an epoxy resin and that the polyimide resist ink has low printability because its highly polar solvent absorbs water to hinder control of film thickness.

Another disadvantage of this technique is that fine lands or terminals can not be formed.

(2) Technique of laminating a polyimide film carrying an adhesive to the copper-clad film.

This is a technique in which future sites for lands or terminals are punched from a polyimide film carrying an adhesive layer using a mold or a die, then this film is contact-bonded under heat or otherwise bonded to a printed circuit board to form a flexible printed wiring board. It has the disadvantage that it has difficulty in forming fine lands or terminals even if the precision of the mold or die is improved and that the microcircuit may be contaminated with the adhesive squeezed out on bonding.

Flexible printed wiring boards on which a semiconductor chip is to be mounted should be flat. However, this technique invites partial contraction or curling due to the non-uniform thickness of the insulating protective film during printing it to damage its flatness and induce contraction between conductors.

Moreover, this technique can not satisfy the recent demands for dimensional stability in and between conductors to form a flexible printed circuit in which an insulating protective layer is buried between fine conductors forming circuit elements to ensure absolute isolation between adjacent conductors at terminals or the like.

(3) Technique of laminating a film-like polyamic acid to the copper-clad film by solvent activity or other means, then imidating the polyamic acid.

This technique is easy to practice on film-like materials, but requires some protection for working atmosphere because a solvent such as N-methyl-2-pyrrolidone is used as an active solvent.

If a thick tin plating or gold plating is applied to improve adhesion between the polyamic acid layer and the copper foil surface, the plating solution penetrates into the interface with the copper foil to lower electric characteristics such as insulating characteristics and adhesive force.

Moreover, the polyamic acid resin remains on the surface of the copper foil at access sites such as lands to impair solder wetability.

In view of the above problems of the prior art, an object of the present invention is to obtain a flexible printed wiring board with good flatness with the protect layer formed thereon.

Another object of the present invention is to improve dimensional accuracy and solderability at access sites such as lands in a flexible printed wiring board.

Still another object of the present invention is to obtain a flexible printed wiring board with good adhesion to conductors wherein any plating solution can not penetrate into the interface with conductors during plating processes.

Still another object of the present invention is to obtain a flexible printed wiring board with high heat resistance.

SUMMARY OF THE INVENTION

As a result of careful studies to overcome the above problems, we found that a flexible printed wiring board with high flatness which may overcome the above problems is obtained by using a metal clad film curled by thermally contracting an insulating resin layer as a protect layer applied on one surface of a conductor and then thermally contracting an insulating resin layer applied on the other surface of the conductor, and thus accomplished the present invention.

Accordingly, the present invention relates to a process for manufacturing a metal clad film used for a flexible printed wiring board, comprising the following steps of: forming an insulating resin layer on one surface of a foil-like conductor by applying a solution containing an insulating resin, and thermally contracting the insulating resin layer so as to form a convex surface, so that a metal clad film has a convex surface on the exposed side of the foil-like conductor.

Furthermore, the present invention relates to a process for manufacturing a flexible printed wiring board comprising the following steps of: forming an insulating resin layer on one surface of a metal foil by applying a solution containing an insulating resin, thermally contracting the insulating resin so that the other surface of the metal foil forms a convex surface of a curling surface to form an insulating resin layer, subjecting the foil-like conductor to a given treatment to form a given printed circuit pattern on the insulating resin layer, forming a protective resin layer on the printed circuit by applying the solution containing an insulating resin, and thermally contracting the protective layer so as to form a convex layer so that the flexible printed wiring board regains a flatness because contraction of the insulating resin layer and contraction of the protective resin layer cancel each other.

According to the present invention, a flexible printed wiring board with good flatness is obtained by using an intentionally curled metal clad film and thermally contracting a resin for forming a protective layer applied on the other surface of the conductor to absorb and correct the curling of the insulating resin layer and conductor of the metal clad film.

The present invention, which is not based on printing, can improve dimensional accuracy at access sites as described above, and also improve solderability at access sites by applying a resin solution to form the protective layer so that the resin at the access sites can readily be dissolved.

The present invention uses resin solutions both for the insulating resin layer and protective layer to provide high adhesion to conductors without causing penetration of the plating solution into the interface with conductors during plating processes.

The present invention forms the insulating resin layer and protective layer by heat treatment, which ensures that the reaction of resins can be fully completed to improve heat resistance. As a result, no blister occurs and flatness can be maintained during solder immersion.

In this case, it is also effective to form a given printed circuit pattern and/or the protective layer while the clad film is kept flat in the present invention.

Namely, the inventions obviate difficulty in the formation of printed circuit pattern and the coating process of a resin solution or other processes on forming the protective layer.

BRIEF DESCRIPTION OF THE DRAWINGS

Preferred embodiments of the process for manufacturing a flexible printed wiring board according to the present invention will now be described in detail with reference to the accompanying drawing in which:

Each of FIG. 1a to FIG. 1g is a flow sheet showing an example of the process for manufacturing a flexible printed wiring board according to the present invention.

Numeral references represent the following elements: 1: polyimide film; 1a: polyamic acid layer; 2: copper foil; 2A: circuit pattern; 3: copper-clad film; 4: support 5: protective film; 5a: polyamic acid layer; 10: flexible printed wiring board.

DETAILED DESCRIPTION OF THE INVENTION (1) Formation of a suitable copper-clad film and circuit Suitable conductors in the present invention are, for example, copper foils including electrolytic copper foils and rolled copper foils.

The thickness of copper foils is preferably 35 $\mu$m or less, most preferably from 8 to 18 $\mu$m to form a microcircuit.

It is difficult to form a microcircuit from copper foils having a thickness greater than 18 $\mu$m, while wrinkles or other damages are likely to occur to hinder operation during coating processes at a thickness less than 8 $\mu$m.

Copper foils most preferably have not been subjected to surface treatment, though they may be surface-treated with zinc or chromium or by oxidation or the like preferably at a roughness of 10 $\mu$m or less, more preferably 7 $\mu$m or less to form a microcircuit. When the roughness is 10 $\mu$m or more, it is difficult to thermally contract by heat treatment to designated level.

Copper foils may have been subjected to matte treatment, zinc plating or oxidation treatment to improve bond strength. They also may have been subjected to chemical surface treatment with aluminium alcoholate, aluminium chelate, silane coupling agent, imidazole, etc.

On such a copper foil forming a conductor is applied a resin solution showing a linear thermal expansion coefficient after curing near the linear thermal expansion coefficient of the copper foil of 18–20×10$^{-6}$/K after annealed at a temperature for imidation of the polyamic acid.

FIGS. 1a to 1g are flow sheets showing an example of the process for manufacturing a flexible printed wiring board according to the present invention.

Figure 1A:
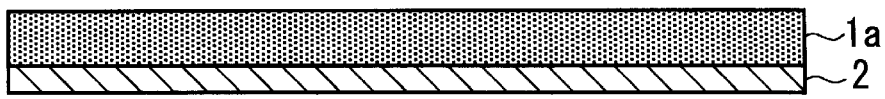

In the present invention, a polyamic acid solution which is a precursor of a polyimide resin having a linear thermal expansion coefficient of 20–30×10$^{-6}$/K, preferably 21–24×10$^{-6}$/K after polyimidation is applied on one surface of a copper foil 2 and dried to form a polyamic acid layer 1a, for example, as shown in FIG. 1A.

Here, a solution containing from 5 to 30% by weight of a polyamic acid resin is applied on the surface of the copper foil 2 using a knife coater, roll coater, gravure coater or the like. The polyamic acid layer 1a is applied to have a thickness of from 10 to 50 $\mu$m after drying from the viewpoint of satisfying mechanical strength, electric insulation and appearance characteristics linked to solvent evaporation.

Then, the solvent is evaporated to imidate the polyamic acid layer 1a. The present invention is not limited to any specific imidation process. In order to prevent oxidative deterioration of the polyimide film 1 and copper foil 2, the imidation process is preferably carried out in an inert gas atmosphere such as nitrogen gas at a temperature of 230° C. or more.

Figure 1B:
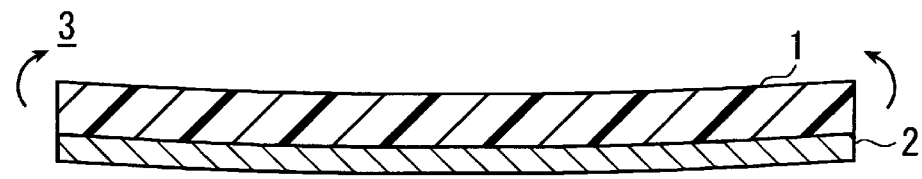

Thus, the polyamic acid is thermally contracted during imidation to give a copper-clad film 3 curling with the other surface (lower face) of the copper foil 2 prominent, as shown in FIG. 1b.

The extent of curling of the copper clad film 3 is preferably controlled so that the polyimide film 1 from which the copper foil 2 has been removed has a radius of curvature of 500 mm or less, preferably from 200 mm to 50 mm.

The copper clad film carrying the copper foil 2 preferably has a radius of curvature greater than 500 mm with the surface of the copper foil 2 prominent.

In the present invention, an additional polyamic acid solution can be applied on said polyamic acid layer 1a. In this case, the residual solvent content in the polyamic acid applied on the preceding layer is preferably from 50 to 80% by weight.

If the residual solvent content in the polyamic acid is less than 50% by weight, ply separation occurs at the interface between laminated films.

If the residual solvent content in the polyamic acid is greater than 80% by weight, however, the film foams during imidation to result in appearance failure.

The temperature at which the polyamic acid is dried is not specifically limited so far as the film does not foam as the solvent evaporates. When N-methyl-2-pyrrolidone is used as a solvent, however, the maximum temperature should be 170° C. or less to keep the residual solvent content at 80% by weight or less because the boiling point of N-methyl-2-pyrrolidone is 204° C.

The polyamic acid solution is applied in multiple layers, then heated at 230° C. to reach the residual solvent content of 0%.

The polyamic acid is partially imidated during then, after which it is heated at from 280 to 350° C. to reach an imidation degree of 80% or more.

In case of the present invention, the polyimide resin layer on the copper-clad film 3 can be made in a multilayer structure preferably consisting of three layers or less. More than three layers uneconomically invite extra costs.

An epoxy resin may be added to the polyamic acid solution to improve adhesive force enough to prevent ply separation between individual polyimide resin layers forming a multilayer structure or improve adhesive force to the copper foil 2. Suitable epoxy resins include common epoxy resins such as bisphenol A type, novolak phenol type or the like. A curing agent for the epoxy resin may be optionally added. In such a case, the curing agent for the epoxy resin is added into the polyamic acid solution and the epoxy resin is added into other polyamic acid solution.

Figure 1C:
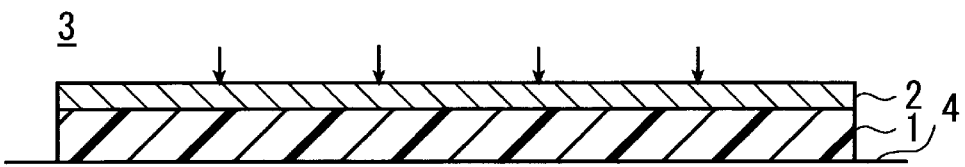

A circuit is formed on the copper foil 2 of copper-clad film 3 formed by the above described process. In case of the present invention, the copper clad film 3 is pressed against a support 4 with the polyimide film 1 downward as shown in FIG. 1c, because the copper clad film 3 curls described above. This can be accomplished by sucking air from the downside of the support 4, for example.

Figure 1D:
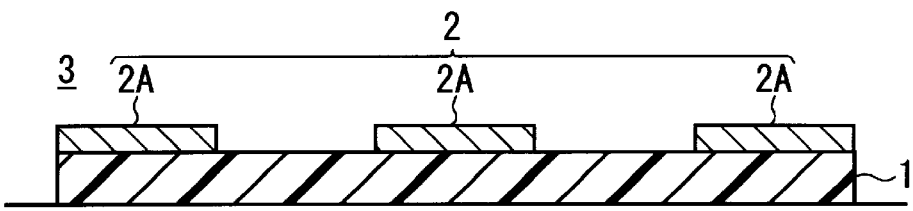

The circuit is formed by, for example, subtractive process. Namely, a liquid resist is applied on the surface of the copper foil 2, dried, exposed, developed and then the copper foil 2 is etched with an aqueous cupric chloride solution. Thus, a circuit pattern 2A is formed on the polyimide film 1, as shown in FIG. 1d.

(2) Polyamic acid resin as a precursor of a polyimide forming a protective layer Polyamic acids can be synthesized from an acid dianhydride and a diamine.

Suitable acid dianhydrides include, for example, pyromellitic dianhydride, biphenyltetracarboxylic dianhydride, bis(3,4-dicarboxyphenyl)sulfone dianhydride, bis(3,4-dicarboxyphenyl)ether dianhydride, benzophenone tetracarboxylic dianhydride.

It is not preferable that any undissolved polyamic acid resin remains on the copper foil 2 at access sites such as lands or terminals on which solder or gold will be plated or a component will be mounted by soldering.

Polyamic acid resins are soluble in aqueous alkaline solutions because of the presence of carboxylate groups in the polyamic acid resins. Namely, its solubility is thought to depend on the acidity of the acid dianhydride from which a polyamic acid resin is derived because carboxylate groups are produced by ring opening of acid dianhydrides.

Therefore, it is preferable to use a polyamic acid resin containing pyromellitic dianhydride (PMDA) as an acid element, in order to dissolve it in aqueous alkaline solutions to leave no resin at access sites.

On the other hand, the solubility of polyamic acid resins in aqueous alkaline solutions does not largely depend on the nature of diamine.

Diamines used in the present invention are not specifically limited, but preferably show a linear thermal expansion coefficient of $20 \times 10^{-6}$/K or more, more preferably $20–30 \times 10^{-6}$/K after polyimidation.

Namely, the influence of heat treatments of the flexible printed wiring board can be eliminated by using a diamine having a linear thermal expansion coefficient near that of the copper foil 2, as described above.

Preferably, suitable such diamines include, for example, p-phenylenediamine, 4,4'-diaminodiphenyl ether, 2,2'-bis[4-(4-aminophenoxy)phenyl]propane, 2,2'-bis[4-(4-aminophenoxy)phenyl]sulfone, 4,4'-diaminobenaznilide, 1,4-bis(4-aminophenoxy)benzene, etc.

(3) Synthesis of polyamic acid resins

Initially, an acid dianhydride and an aromatic diamine mentioned above are reacted in a highly polar solvent. This reaction is an exothermic reaction, which involves cooling at need to control the temperature.

This reaction is normally carried out at a temperature of 0–90° C., preferably 5–50° C. If the viscosity of the reactant solution is high, it can be lowered by a heat treatment at a temperature elevated up to near 90° C.

The acid dianhydride and aromatic diamine may be added simultaneously, or preferably either one of the acid dianhydride and aromatic diamine may gradually added into a solution or suspension of the other in a polar solvent to react them.

The molar ratio between both components is preferably equimolar, but either one may be used in excess amounts within the range from 10:9 to 9:10.

Suitable polar solvents include pyrrolidone solvents such as N-methyl-2-pyrrolidone, acetamide solvents such as N,N'-dimethylacetamide, phenol solvents such as cresol, but N-methyl-2-pyrrolidone is preferable from the viewpoint of safety. Said polar solvents may be used in admixture with, for example, xylene, toluene, ethylene glycol monoethyl ether, etc.

Anti-corrosive agents can be added to polyamic acid solution because carboxylate groups of polyamic acids may attack the conductor copper foil 2. Anti-corrosive agents can also be expected to improve bond strength at the interface of the copper foil 2 in addition to anti-corrosive function.

Such anti-corrosive agents include, for example, triazole compounds such as 3-(N-salicyloyl)amino-1,2,3-triazole or imidazole compounds such as 2-methylimidazole and salts thereof.

Anti-corrosive agents are preferably added in an amount of from 1 to 10 parts by weight per 100 parts by weight of a polyamic acid.

(4) Formation of a cover film (circuit protective layer)

Figure 1E:
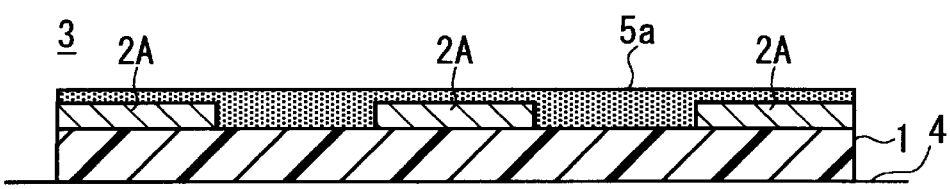
Figure 1F:
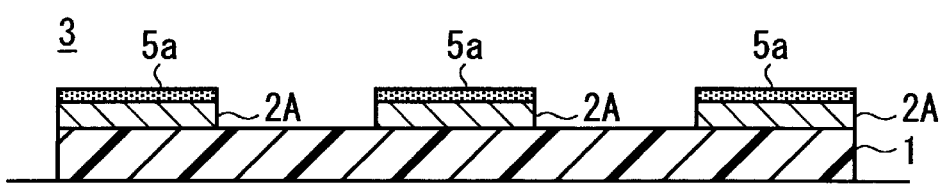

As shown in FIG. 1e, a polyamic acid resin solution is applied on the copper-clad film 3 on which a circuit has been formed, whereby a polyamic acid layer 5a is formed and then, the solvent is evaporated. Also in this case, the copper clad film 3 is pressed against a support 4 with the polyimide film 1 downward as shown in FIG. 1e.

Polar solvents such as N-methyl-2-pyrrolidone having a high boiling point may remain, but this is preferred for the present invention. Here, solvents remain in an amount of from 0 to 60 parts by weight, preferably from 30 to 50 parts by weight per 100 parts by weight of a film-like polyamic acid resin. If the residual solvent content exceeds 60 parts by weight, evaporation is insufficient so that the accuracy for forming access holes during a later process will be deteriorated.

If the drying temperature is too high, however, an imidation reaction of the polyamic acid resin simultaneously occurs during drying. When the polyamic acid is partially imidated, the solubility of the polyamic acid resin in aqueous alkaline solutions is affected so that the polyamic acid resin remains at the sites for access holes on the surface of the copper foil 2. In view of the above, the polyamic acid should preferably be dried at a temperature of 160° C. or less, more preferably from 80 to 150° C.

In order to achieve flatness, the imidation degree of the polyamic acid is preferably 20% or less, more preferably 10% or less.

In the present invention, polyamic acid resin solutions can be applied in from one to three layers.

In this case, the linear thermal expansion coefficient of individual polyimide resins forming various layers is preferably $20 \times 10^{-6}$/K or more, more preferably $20–30 \times 10^{-6}$/K as described above.

When the protective layer for a circuit to be formed may be thin, one layer is applied to allow the interlaminar dielectric strength to satisfy the demand of the product.

The thickness of the protective layer is normally from 3 to 10 $\mu$m. If the thickness of the protective layer is less than 3 μm, the dielectric strength is lowered. If the thickness of the protective layer is greater than 10 μm, however, curling occurs. Therefore, the protective layer should be formed by applying polyamic acid resin solutions in two or more layers to control curling by the thickness of the polyimide resin in the outer layer.

In the present invention, access sites such as lands or terminals are formed by etching a polyimide resin which is in a state of a precursor based on a polyamic acid with an aqueous alkaline solution as conventionally used in manufacturing processes of semiconductor devices or the like.

In this case, a photoresist developable with a neutral or weakly acid aqueous solution and having an excellent resistance to alkaline solutions is applied on a polyimide resin layer in a state of a polyamic acid to have a thickness of about 10 μm after evaporation of the solvent (not shown).

Then, the photoresist is exposed through a mask corresponding to the circuit pattern 2A and developed.

After the polyamic acid layer is etched with a 10% aqueous potassium hydroxide solution and the photoresist is stripped off with a strongly acid aqueous solution (FIG. 1f), the polyamic acid layer 5a is imidated. Here, imidation preferably takes place under typical conditions at from 280 to 350° C. within 2 hours.

Figure 1G:
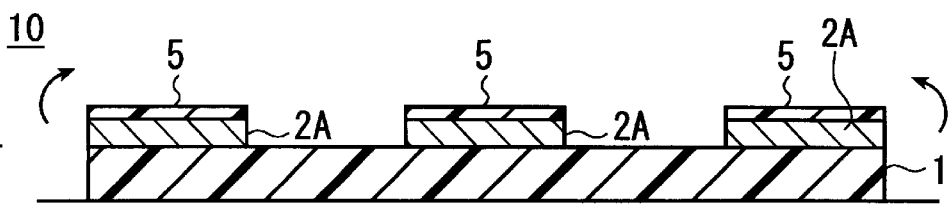

On such imidation, the polyamic acid layer 5a is thermally contracted to absorb and correct curing of the polyimide film 1 and copper foil 2 of the copper-clad film 3, whereby a flexible printed wiring board 10 with good flatness having a protective film 5 is obtained, as shown in FIG. 1g.

EXAMPLES

The following examples further illustrate flexible printed wiring boards according to the present invention in contrast to comparative examples.

Preparation of Polyamic Acid Solutions

Synthesis Example 1

In a 60-liter reaction vessel with a temperature-controllable jacket, 0.866 kg (8.00 moles) of P-phenylenediamine (PDA, Mitsui Chemicals, Inc.) and 1.603 kg (8.00 moles) of 4,4'-diaminodiphenyl ether (DPE, Wakayama Seika Kogyo Co., Ltd.) were dissolved in about 44 kg of an N-methyl-pyrrolidone (NMP, Mitsubishi Chemical Corp.) in a nitrogen gas atmosphere.

Then, the reaction was continued for 3 hours while gradually adding 3.523 kg (16.14 moles) of pyromellitic dianhydride (PMDA, Mitsubishi Gas Chemical Co., Inc.) at 50° C. to give a polyamic acid solution having a solid content of about 12% and a viscosity of 20 Pa·s at 25° C.

This polyamic acid solution was applied on a copper foil to have a film thickness of 25 μm after polyimidation and the solvent was evaporated in a continuous oven at 80–160° C., after which the temperature was elevated to 230–350° C. and maintained at 350° C. for 30 minutes. Then, the foil was partially etched off with a cupric de solution to give a polyimide film. This polyimide had a linear thermal expansion coefficient of $20 \times 10^{-6}$/K.

Synthesis Examples 2–6

The procedure of Synthesis example 1 was repeated with different acid dianhydrides and diamines to synthesize polyamic acid solutions. Details of formulations and measurement results of linear thermal expansion coefficient are shown in Table 1.

TABLE 1

Synthesis Examples of Polyamic Acids

| Synthesis Example No. | Type of Dainhydride | Diamine (a) | Diamine (b) | Molar Ratio Diamine (a)/(b) | Linear Expansion Coefficient $\times 10^{-5}$/K |
|---|---|---|---|---|---|
| 1 | PMDA | DPE | PDA | 50/50 | 20 |
| 2 | PMDA | DPE | — | 100/0 | 31 |
| 3 | PMDA | DPE | PDA | 70/30 | 24 |
| 4 | PMDA | DPE | DABA | 75/25 | 22 |
| 5 | BPDA | DPE | — | 100/0 | 35 |
| 6 | DSDA | DPE | — | 100/0 | 39 |

PMDA: Pyromellitic dianhydride
BPDA: Biphenyltetracarboxylic dianhydride
DSDA: Bis(3,4-dicarboxyphenyl)sulfone dianhydride
DPE: 4,4'-Diaminodipheny ether
PDA: p-Phenylenediamine
DABA: 4,4'-Diaminobenzanilide Preparation of a copper-clad film The polyamic acid solution of Synthesis example 2 was applied on an electrolytic copper foil with thickness of 18 μm (CF-T9-LP, Fukuda Metal) to have a film thickness of 3 μm after polyimidation, and the solvent was evaporated. The residual solvent content was 45%.

The polyamic acid solution of Synthesis example 1 was applied on this first polyamic acid layer to have a film thickness of 18 μm after polyimidation. The total residual solvent content in the first and second layers was 75%.

The polyamic acid solution of Synthesis example 2 was further applied on this second polyamic acid layer to have a film thickness of 4 μm after polyimidation. The total residual solvent content in these three layers was 70%.

Then, the laminate was thermally treated at a temperature of 230° C. for 5 minutes. The residual solvent content was 1% or less. The temperature was elevated to 350° C. over 1 hour in a nitrogen gas atmosphere, and the laminate was imidated at a temperature of 350° C. for 15 minutes to prepare a copper-clad film.

This copper-clad film slightly curled up on the copper foil side, but the radius of curvature was infinite. The copper foil was removed with a cupric chloride solution to give a polyimide film. This polyimide film curled up on the former copper foil side in terms of a radius of curvature of 200 mm.
Formation of a circuit A liquid resist (trade name RX-20, Tokyo Ohka Kogyo Co., Ltd.) was applied on the copper foil of the copper-clad film prepared by the procedure described above, and dried, exposed and developed, then copper was etched with an aqueous cupric chloride solution to form parallel conductors having a width of 50 μm at a pitch of 100 μm with a round land of 5 mm in diameter.
Evaluation test methods
(1) Determination of linear thermal expansion coefficient Determination was based on the data measured in the range of from 100 to 350° C. according to the tensile method under a load of 2.5 to 5.0 grams using a thermal mechanical analyzer (TMA/SCC150CU, Sll).
(2) Imidation degree Imidation degree was calculated from the percentage of the absorption of imide groups of each sample measured by infrared absorption spectrometry at an absorption wavelength of 1780 cm$^{-1}$ to the absorption of imide groups of the same sample after imidated to 100%.
(3) Determination of curling The copper-clad film as such or deprived of the copper foil by etching or each flexible printed wiring board was cut into a size of 10 cm×10 cm and mounted on a horizontal board with the convex side downward to calculate the radius of curvature from the average of heights at the four corners.
(4) Determination of flatness Whether or not contraction or blister locally occurs in and between conductors of each flexible printed wiring board was visually observed.
(5) Etching accuracy of the protective film Round holes of 3 mm and 0.5 mm in diameter were formed in the protective film on the round land of 5 mm in diameter formed on the copper-clad film. Evaluation was based on the circularity of the holes and the smoothness of the wall.

A protective film was formed between parallel conductors with a pitch of 100 μm. A magnifier was used to evaluate burying of the protective film between conductors from its overhang on the conductors and smoothness of the wall.
(6) Residues in the protective film The hole of 3 mm in diameter in the protective film formed on the round land of 5 mm in diameter was observed with a magnifier to determine whether or not unetched polyamic acid resin (protective film) exists.
(7) Penetration of plating solution Parallel conductors having a pitch of 100 μm were subjected to electroless tin plating at a temperature of 60° C. for 15 minutes to visually observe whether or not the plating solution penetrates from the edge of the protective film.

(8) Heat resistance to soldering

Each sample was immersed in solder at a temperature of 300° C. for 60 seconds. Blister in the protective film and flatness of the printed wiring board were visually observed.

(9) Adhesion of the protective film

Bond strength to the copper foil surface of each copper-clad film and the polyimide surface exposed by etching the copper foil was determined in the direction of 90°.

Example 1

The polyamic acid solution synthesized in Synthesis example 3 was applied on a copper-clad film carrying a circuit pattern to have a film thickness of 10 μm after polyimidation.

Here, the laminate was dried at 160° C. or less. The imidation degree of the dried polyamic acid layer was 7%, and the residual solvent content was 45 parts by weight.

On this polyamic acid layer was applied a photoresist having an excellent resistance to alkalis (NR-41 based on nylon-oligoester, Sony Chemicals Corp.) to have a thickness of about 10 μm after evaporation of the solvent.

The lpolyamic acid layer was exposed and developed through a negative film capable of forming holes of 3 mm and 0.5 mm in diameter on the round land of 5 mm in diameter and also capable of forming a protective film layer between parallel conductors having a pitch of 100 μm, and etched with a 10% aqueous potassium hydroxide solution. After the photoresist was stripped off with an aqueous acidic solution, heat treatment took place at a temperature of 230° C. for 5 minutes and 350° C. for 15 minutes for polyimidation.

Thus prepared flexible printed wiring board showed good flatness without curling or contraction or blister locally occurring in and between conductors as shown in Table 2. The circularity of the holes of 3 mm and 0.5 mm in diameter was good and the wall was smooth.

The protective film formed between parallel conductors having a pitch of 100 μm was observed with a magnifier to show that it was fully buried between conductors without overhanging the conductors.

The copper surface of the hole of 3 mm in diameter was observed with a magnifier to show that any unetched polyamic acid resin was not deposited.

On the other hand, parallel conductors having a pitch of 100 μm were subjected to electroless tin plating at 60° C. for

TABLE 2

Evaluation Results of Examples and Comparative Examples

| | | Characteristics | | | | | | | | |
|---|---|---|---|---|---|---|---|---|---|---|
| | | Polyamic Acid | Protective Film Thickness μm | Flatness in Normal state | Etching accuracy of Protective film | Residual of Polyamic acid | Penetration of Plating solution | Heat Resistance Blister | Heat Resistance Flatness | Bond Strength Cu Surface | Bond Strength Pl Surface |
| Example | 1 | 2 | 10 | Good | Good | No | No | No | Good | 1.0 | Failure |
| | 2 | 2 | 7 | Good | Good | No | No | No | Good | 0.9 | Failure |
| | 3 | 2 | 3 | | | | | | | | |
| | | 3 | 15 | Good | Good | No | No | No | Good | 1.2 | Failure |
| | 4 | 4 | 20 | Good | Good | No | No | No | Good | 1.0 | Failure |
| | 5 | 2 | 2 | | | | | | | | |
| | | 4 | 10 | Good | Good | No | No | No | Good | 1.0 | Failure |
| Comparative Example | 1 | 5 | 10 | Somewhat curling | Etching Failure | Yes | — | — | — | — | — |
| | 2 | 6 | 10 | Somewhat curling | Etching Failure | Yes | — | — | — | — | — |
| | 3 | *1 | 10 | Somewhat curling | Poor | No | Yes | Yes | Poor | Not determinable | |
| | 4 | *2 | 25 | Good | Poor | Adhesive Squeezed out | Yes | No | Good | 0.5 | 1.5 |

*1 Printing with resist ink
*2 Cover Film 15 minutes. No penetration of the plating solution was observed between the protective film and the copper-clad film.

The sample was immersed in a solder bath at 300° C. for 60 seconds. No blister occurred in the protective film and the flatness of the wiring board could be maintained.

The protective film had a bond strength of 1.0 kg/cm to the copper foil surface and well adhered to the polyimide surface of the copper-clad film resulting in failure.

Example 2

A flexible printed wiring board was prepared similarly to Example 1 except that the thickness of the protective film was 7 μm, and evaluated. The results are shown in Table 2.

Example 3

A flexible printed wiring board was prepared similarly to Example 1 except that the polyamic acid of Synthesis example 2 and the polyamic acid of Synthesis example 3 were applied to have thicknesses of 3 μm and 15 μm, respectively after polyimidation, and evaluated. The results are shown in Table 2.

Example 4

A flexible printed wiring board was prepared similarly to Example 1 except that the polyamic acid of Synthesis example 4 was applied to have a layer thickness of 20 μm after polyimidation, and evaluated. The results are shown in Table 2.

Example 5

A flexible printed wiring board was prepared similarly to Example 1 except that the polyamic acid of Synthesis example 2 and the polyamic acid of Synthesis example 4 were applied to have thicknesses of 2 μm and 10 μm, respectively after polyimidation, and evaluated. The results are shown in Table 2.

As evident from Table 2, the flexible printed wiring boards of Examples 2 to 5 also showed good flatness without curling and showed good circularity of the holes of 3 mm and 0.5 mm in diameter with smooth wall, similarly to Example 1.

Moreover, the protective film was fully buried in parallel conductors without overhanging conductors.

Furthermore, any polyamic acid resin was not deposited on the copper surface of the hole of 3 mm in diameter.

Electroless tin plating did not cause penetration of the plating solution between the protective film and the copper-clad film from its edge, and immersion in a solder bath for 60 seconds caused no blister of the protective film with the flatness of the wiring board being kept.

The protective film had a bond strength of 0.9 to 1.2 kg/cm to the copper clad surface and well adhered to the polyimide surface of the copper-clad film resulting in failure.

Comparative Example 1

A flexible printed wiring board was prepared similarly to Example 1 except that the polyamic acid of Synthesis example 5 was used, and evaluated. The results are shown in Table 2. Blanks in Table 2 mean that the experiments were ineffective.

As shown in Table 2, the flexible printed wiring board of Comparative example 1 somewhat curled and showed etching failure.

Deposition of the polyamic acid resin was observed on the copper surface of the hole of 3 mm in diameter.

Comparative Example 2

A flexible printed wiring board was prepared similarly to Example 1 except that the polyamic acid of Synthesis example 6 was used, and evaluated. The results are shown in Table 2.

As shown in Table 2, the flexible printed wiring board of Comparative example 2 also somewhat curled and the polyamic acid was etched to only a half of the depth of the hole of 3 mm in diameter. This may be due to the low acidity of the dianhydride DSDA.

Deposition of the polyamic acid resin was also observed on the copper surface of the hole of 3 mm in diameter.

Comparative Example 3

A protective film was formed by printing with a commercially available resist ink (FCR82G, Asahi Chemical Co., Ltd.) on a silk screen plate having the same pattern as that of the negative film used in Example 1. Evaluation results are shown in Table 2.

As shown in Table 2, the flexible printed wiring board of Comparative example 3 also somewhat curled and showed poor circularity of the holes of 3 mm and 0.5 mm in diameter.

Deposition of the polyamic acid resin was observed on the copper surface of the hole of 3 mm in diameter.

Electroless tin plating caused penetration of the plating solution between the protective film and the copper-clad film from the edge, and immersion in a solder bath for 60 seconds caused blister in the protective film. In addition, the flatness of the flexible printed wiring board was also poor.

Comparative Example 4

A commercially available cover film (CFK-7, Sony Chemicals Corp.) consisting of a polyimide film (Kapton 100H, Toray Industries, Inc.) having a thickness of 25 μm coated with an adhesive was processed using a die capable of reproducing the same pattern as that of the negative film used in Example 1. This cover film was laminated to the copper-clad film carrying a circuit by using a heating press. Evaluation results are shown in Table 2.

As shown in Table 2, the flexible printed wiring board of Comparative example 4 showed poor circularity of the holes of 3 mm and 0.5 mm in diameter and the adhesive squeezed out on the copper surface of the hole of 3 mm in diameter.

Electroless tin plating caused penetration of the plating solution between the protective film and the copper-clad film from the edge.

The bond strengths of the protective film to the copper foil surface and to the polyimide surface of the copper-clad film were 0.5 kg/cm and 1.5 kg/cm, respectively, both of which were inferior to those of Examples 1 to 5.

ADVANTAGES OF THE INVENTION

According to the present invention, a flexible printed wiring board with good flatness can be obtained as the foregoing description demonstrates.

Also according to the present invention, the dimensional accuracy and solderability at access sites can be improved.

Another advantage of the present invention is that adhesion to conductors is high and any plating solution can not penetrate into the interface with conductors during plating processes.

Still another advantage of the present invention is that a flexible printed wiring board with high heat resistance can be obtained.

What is claimed is:

1. A process for manufacturing a metal clad film used for a flexible printed wiring board, comprising the steps of:
   (a) forming an insulating resin layer on one surface of a metal foil by applying a solution containing an insulating resin, and
   (b) thermally contracting said insulating resin layer so as to form a convex surface, so that a metal clad film has a convex surface on the exposed side of the metal foil and said insulating resin layer has a concave surface.

2. A process according to claim 1, wherein a radius of curvature of said convex surface is 500 mm or less but greater than zero.

3. A process according to claim 1, wherein a radius of curvature of said convex surface is 200 mm to 50 mm.

4. A process for manufacturing a metal clad film for a flexible printed wiring board according to claim 1, wherein said metal foil conductor is made from copper.

5. A metal clad film used for a flexible printed wiring board manufactured by a process according to claim 1.

6. A copper film used for a flexible printed wiring board manufactured by a process according to claim 4.

7. A process for manufacturing a flexible printed wiring board comprising the following steps of:
   (a) forming an insulating resin layer on one surface of a metal foil by applying a solution containing an insulating resin;
   (b) thermally contracting said insulating resin layer so as to form a convex surface, so that an exposed surface of said metal foil has a convex surface and said insulating resin layer has a concave surface;
   (c) subjecting said metal foil to a given treatment to form a given printed circuit pattern on said insulating resin layer;
   (d) forming a protective resin layer on said printed circuit by applying said solution containing an insulating resin; and
   (e) thermally contracting said protective resin layer so that said flexible printed wiring board regains a flatness because contraction of said insulating resin layer and contraction of said protective resin layer cancel each other.

8. A process for manufacturing a flexible printed wiring board according to claim 7, wherein said printed circuit pattern is formed on said insulating resin layer while said metal clad film is kept flat.

9. A process for manufacturing a flexible printed wiring board according to claim 7, wherein said solution layer of a resin for protective layer is applied on said printed circuit pattern while said metal clad film is kept flat.

10. A process for manufacturing a flexible printed wiring board according to claim 8, wherein said solution layer of a resin for protective layer is applied on said printed circuit pattern while said metal clad film is kept flat.

11. A process for manufacturing a flexible printed wiring board according to claim 7, wherein said metal foil is made from copper.

12. A process for manufacturing a flexible printed wiring board according to claim 8, wherein said metal foil is made from copper.

13. A process for manufacturing a flexible printed wiring board according to claim 9, wherein said metal foil is made from copper.

14. A process for manufacturing a flexible printed wiring board according to claim 10, wherein said metal foil is made from copper.

15. A flexible printed wiring board manufactured by a process according to claim 7.

16. A flexible printed wiring board manufactured by a process according to claim 8.

17. A flexible printed wiring board manufactured by a process according to claim 9.

18. A flexible printed wiring board manufactured by a process according to claim 10.

19. A flexible printed wiring board manufactured by a process according to claim 11.

20. A flexible printed wiring board manufactured by a process according to claim 12.

21. A flexible printed wiring board manufactured by a process according to claim 13.

* * * * *